(12) United States Patent
Ghassemi

(10) Patent No.: US 8,188,620 B2
(45) Date of Patent: May 29, 2012

(54) ADJUSTABLE SOLAR CELL NETWORK

(75) Inventor: Mohammad Ghassemi, Las Cruces, NM (US)

(73) Assignee: Noribachi LLC, Hawthorne, CA (US)

( * ) Notice: Subject to any disclaimer, the term of this patent is extended or adjusted under 35 U.S.C. 154(b) by 668 days.

(21) Appl. No.: 12/364,439

(22) Filed: Feb. 2, 2009

(65) Prior Publication Data

US 2010/0193005 A1 Aug. 5, 2010

(51) Int. Cl.
*B23K 11/24* (2006.01)
*H01L 31/00* (2006.01)

(52) U.S. Cl. ........................ 307/112; 136/252

(58) Field of Classification Search ............ 136/244, 136/252; 307/112
See application file for complete search history.

(56) References Cited

U.S. PATENT DOCUMENTS

| 6,268,559 B1 * | 7/2001 | Yamawaki ............. 136/244 |
| 6,476,311 B1 | 11/2002 | Lee et al. |
| 2010/0147354 A1 * | 6/2010 | Takehara et al. ....... 136/244 |

* cited by examiner

*Primary Examiner* — Michael Rutland Wallis
(74) *Attorney, Agent, or Firm* — Scwegman, Lundberg & Woessner, P.A.

(57) ABSTRACT

A system including an array of solar cells having positive and negative rails. A plurality of intermediate nodes are positioned adjacent positive and negative rails of solar cells in the array of solar cells. A plurality of switches are positioned to couple positive nodes to positive rails, couple negative nodes to negative rails and couple positive and negative rails to intermediate nodes.

19 Claims, 4 Drawing Sheets

ADJUSTABLE SOLAR CELL NETWORK

BACKGROUND

Many electronic devices today require different levels of voltage and current to operate. Modules of solar cells may be coupled in series or parallel to provide different levels of voltage, which may be sufficient for some applications. However, the range of voltages and currents may be limited.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Control functions or algorithms described herein may be implemented in hardware or software, such as computer executable instructions stored on computer readable media such as memory or other type of storage devices. Such functions or algorithms may correspond to modules, which are software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system.

Given an arbitrarily large, or small system of solar cells, series and parallel connections between the cells are managed to suit a variety of loads. A set of intelligent switches are controlled such that positive and negative rails of solar cells may be combined in series or parallel configuration with other cells in the system.

Figure 1:
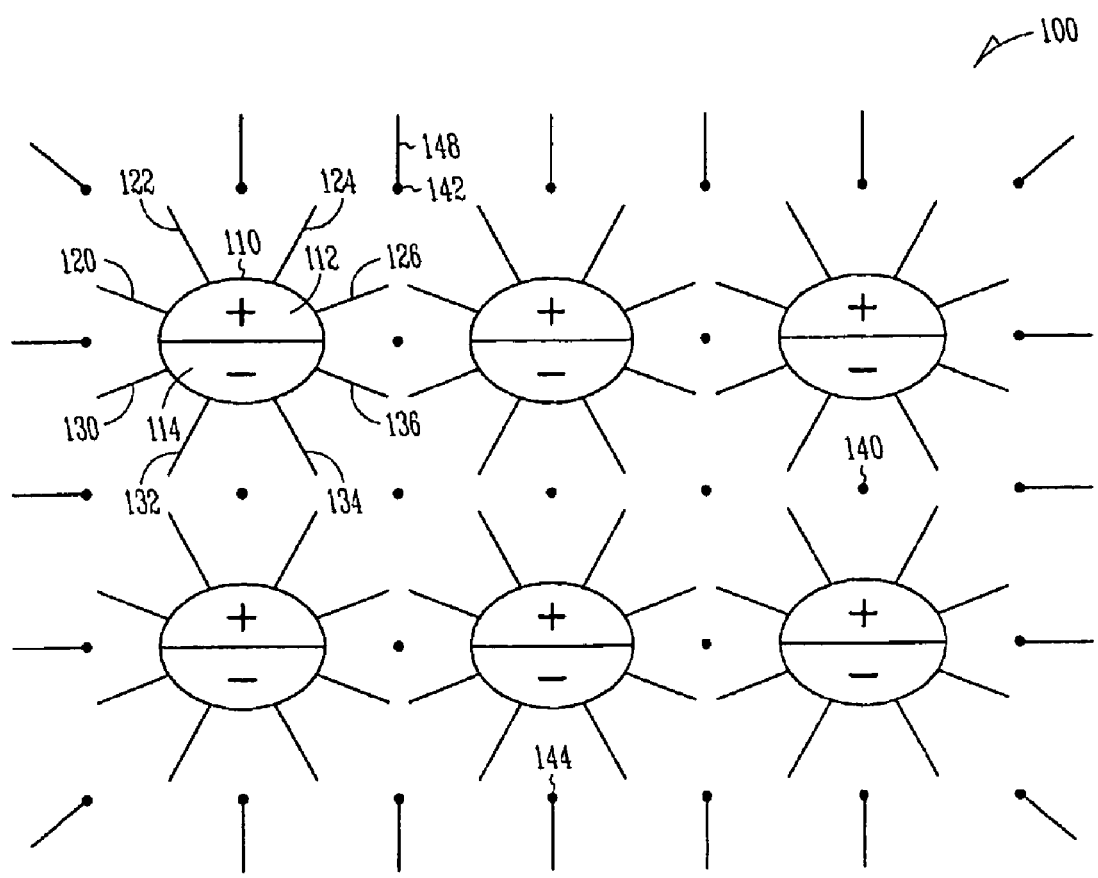
FIG. 1 is a schematic block diagram of an array of electrically configurable solar cells according to an example embodiment.

FIG. 1 is a block schematic diagram of a solar cell system 100 that facilitates multiple different configurations of electrical connections between multiple solar cells. In one embodiment, an array of solar cells 110 have a positive rail 112 and a negative rail 114. In one embodiment, each rail has four associated switches, as indicated at 120, 122, 124 and 126 for rail 112. Negative rail 114 also has four associated switches, as indicated at 130, 132, 134 and 136. The rails may be connected to one or more of the four switch positions by a controller in one embodiment, such as a computer implemented controller or manually for simple embodiments. Note that only one solar cell 110 is numbered, but that in this embodiment, all 6 of the cells have similar rails and switches.

In one embodiment, nodes 140 are disposed between the switches and solar cells, such that using the nodes 140, the cells may be connected in many different electrical configurations. A first type of node 142 may be connected exclusively to positive rail tied switches. The first type of node may be referred to as a positive node 142. A second type of node 144 may be connected exclusively to negative rail tied switches. The second type of node may be referred to as a negative node 144. A third type of node, such as node 146 may be shared between positive rail tied and negative rail tied switches. In one embodiment, nodes on a perimeter of the array include perimeter switches 148, that facilitate coupling to loads or other circuitry.

In one embodiment, the third type of node is disposed mostly between adjacent solar cells and on side edges of the array of solar cells. The third type of node may be referred to as intermediate nodes, and are so disposed to provide great flexibility in configuring the array to obtain desired current and voltage characteristics. Since each cell produces a maximum amount of current, and a fixed voltage that may depend on the materials used to form the cells, connecting them in various configurations can provide great flexibility in terms of the current and voltage provided by the array.

The first type of nodes, positive nodes 142, are disposed along a top edge of the array, while the second type of nodes, negative nodes 144, are disposed along a bottom edge of the array, corresponding to negative rails. The top and bottom edge nodes may be used to both connect cells on the edge in desired configurations, but they also provide contacts to loads utilizing the array as a power source. They are different from the intermediate nodes in that the switches capable of connecting to them are of only one polarity. The intermediate nodes are located where they may be coupled to both positive and negative rails of adjacent cells.

Figure 2:
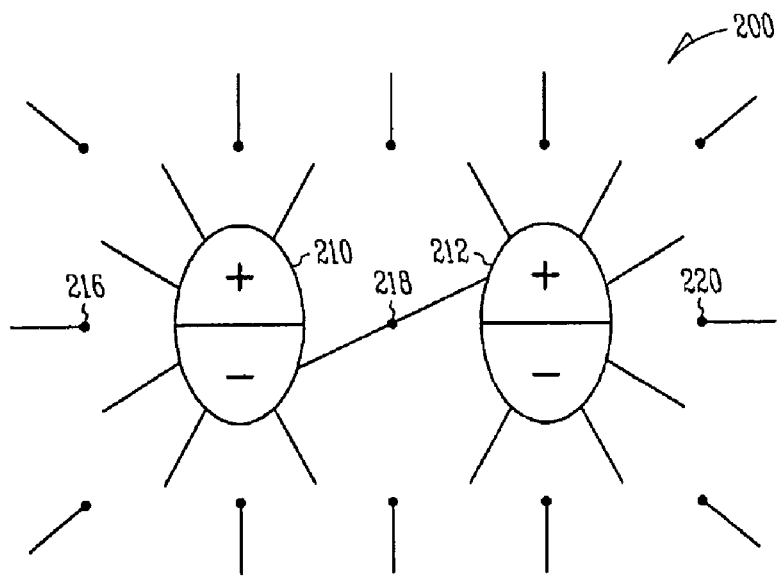
FIG. 2 is a schematic block diagram of a pair of electrically configurable solar cells configured in a series connection according to an example embodiment.

FIG. 2 is a schematic block diagram of a two cell array 200 of electrically configurable solar cells 210, 212 configured in a series connection according to an example embodiment. In this embodiment, there are only two cells, and three intermediate nodes 216, 218, 220. Intermediate nodes 216 and 220 may be connected to either the positive of negative rails of the cells they are adjacent to. If more cells were added, they would have the capability to connect to them in multiple different configurations. Intermediate node 218 is coupled to the negative rail of cell 210 and the positive rail of cell 212, forming a series connection. Note that there are five positive nodes and five negative nodes disposed on the top and bottom of the two cell array 200. These may serve as contacts to a load if desired. Note that to obtain the benefits of the parallel arrangement of cells, the positive rail of cell 210 should be coupled to a positive node, and the negative rail of cell 212 should be coupled to a negative node. Perimeter nodes are also shown with perimeter switches to provide extensive configurability.

Figure 3:
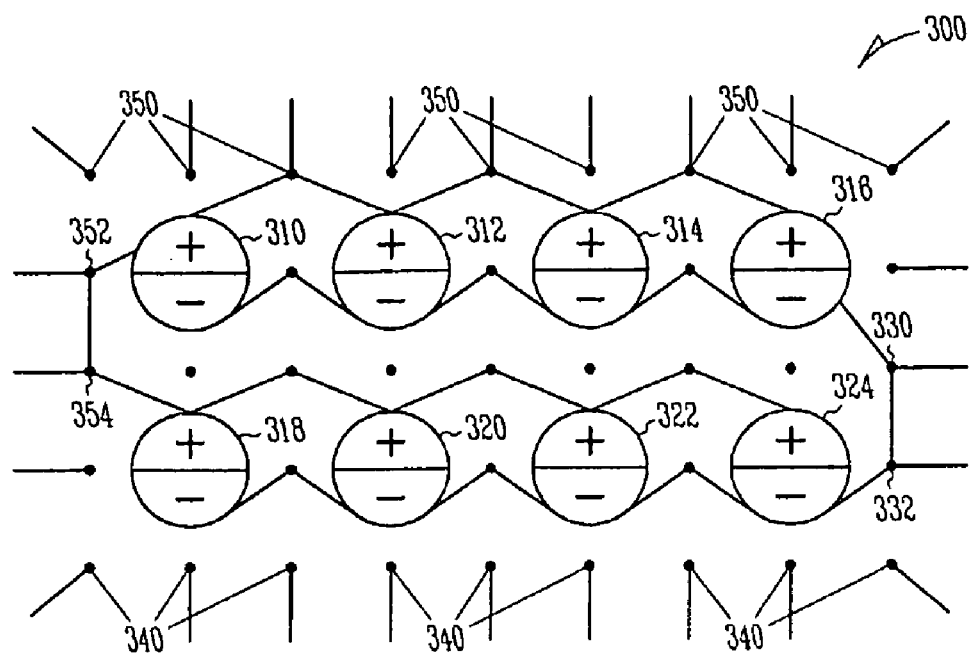
FIG. 3 is a schematic block diagram of an array of electrically configurable solar cells configured in a parallel arrangement according to an example embodiment.

FIG. 3 is a schematic block diagram of an array 300 of electrically configurable solar cells configured in a parallel arrangement according to an example embodiment. Eight cells 310, 312, 314, 316, 318, 320, 322 and 324 are shown in array 300. Using intermediate nodes in one embodiment, the negative rails of a first row of cells, 310, 312, 314, and 316 are coupled to each other. Two more intermediate nodes, 330 and 332 are used to couple the first row of negative rails to negative rails of a second row of cells 318, 320, 322 and 324. Further intermediate nodes are used to couple the negative rails of the second row. Alternatively, the second row of cells may have some or all of their rails coupled to negative nodes 340. To couple the cell to a load, one of the negative rails may be coupled to any available negative node of the second row of cells.

The positive rails in the first row are coupled to each other by selected positive nodes 350. Intermediate nodes 352 and 354 are used to couple the positive rails of the first row of cells to the positive rails of the second row of cells. Intermediate nodes may then be used to couple the positive rails of the second row of cells to each other. To couple the cell to a load, one of the positive rails may be coupled to any available positive nodes. Note that in this embodiment, intermediate nodes, such as perimeter or side nodes, may be provided with switches to allow them to couple to each other independent of a cell rail. This is illustrated by the connections between intermediate nodes 330 and 332, and intermediate nodes 352 and 354. In further embodiments, the switches are part of the nodes as opposed to part of the switches. In further embodiments, the switches may be integrated into one or more of nodes and cells. Such integration may entail forming the switch on a substrate shared with the nodes or cells or physically coupling them together such that they are associated with each other. Perimeter nodes are also shown with perimeter switches to provide extensive configurability.

Figure 4:
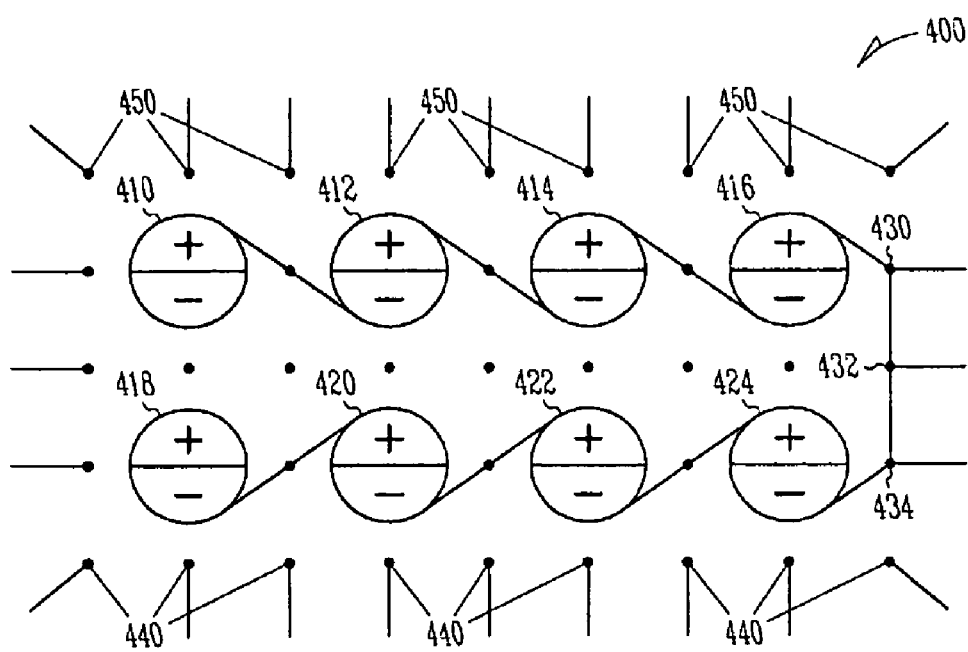
FIG. 4 is a schematic block diagram of an array of electrically configurable solar cells configured in a series arrangement according to an example embodiment.

FIG. 4 is a schematic block diagram of an array of electrically configurable solar cells configured in a series arrangement according to an example embodiment. Eight cells 410, 412, 414, 416, 418, 420, 422 and 324 are shown in array 300. Using intermediate nodes in one embodiment, positive rails are coupled to negative rails of adjacent cells in a first row of cells, 410, 412, 414, and 416. Three more intermediate nodes, 430, 432 and 434 are used to couple the positive rails of the last cell 416 in the first row to the negative rail of cell 424 in a second row of cells 418, 420, 422 and 424. Further intermediate nodes are used to couple the positive rails of cells to negative rails of adjacent cells in the second row. This results in a series connection of all the cells in the array 400.

To couple the array to a load, one of the negative rails may be coupled to any available negative node 440 of the second row of cells. Further, one of the positive rails of the first row may be coupled to any available positive node 450. Note that in this embodiment, perimeter intermediate nodes may be provided with switches to allow them to couple to each other independent of a cell rail. This is illustrated by the connections between intermediate nodes 430, 432 and 434. In further embodiments, the switches are part of the nodes as opposed to part of the switches. In still further embodiments, switches may be integrated into one or more of nodes and cells. Perimeter nodes are also shown with perimeter switches to provide extensive configurability.

Figure 5:
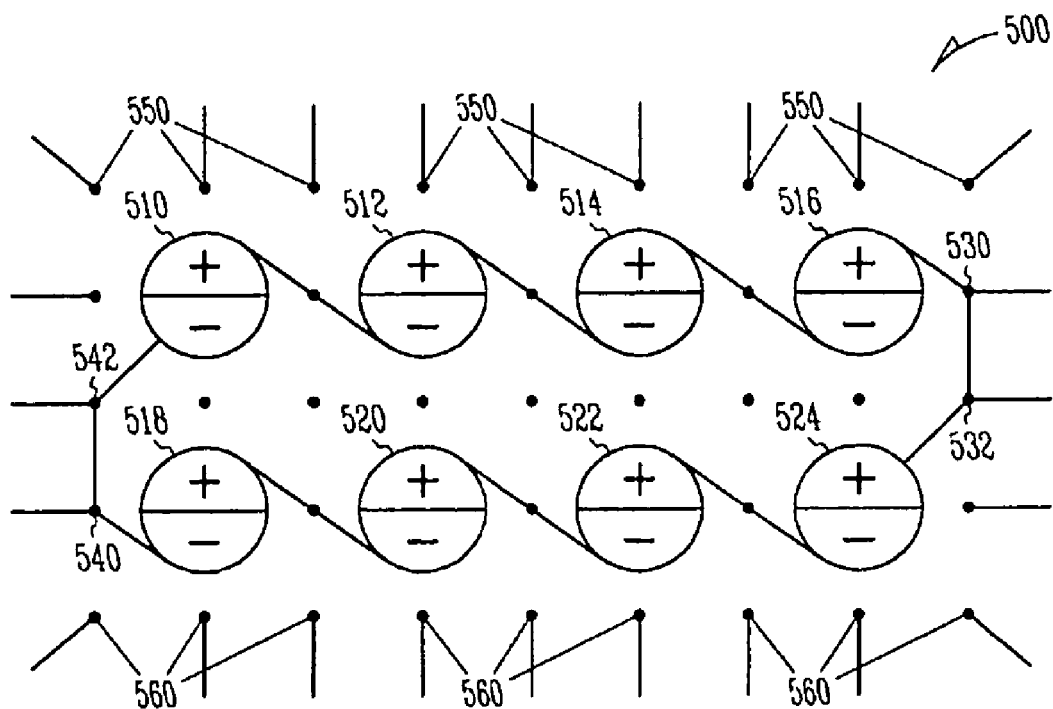
FIG. 5 is a schematic block diagram of an array of electrically configurable solar cells configured to obtain desired current and voltage characteristics according to an example embodiment.

FIG. 5 is a schematic block diagram of an array 500 of electrically configurable solar cells configured to obtain desired current and voltage characteristics according to an example embodiment. Eight cells 510, 512, 514, 516, 518, 520, 522 and 524 are shown in array 500. Using intermediate nodes in one embodiment, positive rails are coupled to negative rails of adjacent cells in a first row of cells, 510, 512, 514, and 516. Two more intermediate perimeter nodes, 530 and 532 are used to couple the positive rail of the last cell 516 in the first row to the positive rail of cell 524 in a second row of cells 518, 520, 522 and 524. Further intermediate nodes are used to couple negative rails of cells to positive rails of adjacent cells in the second row. Finally, the negative rail of cell 518 in the second row is coupled to the negative rail of cell 510 in the first row by the use of intermediate nodes 540 and 542.

The connections formed by the switches in array 500 create two rows of series coupled cells. The two rows are coupled in parallel. By connecting any of the positive rails in the first row to one or more positive nodes 550 and connecting any of the negative rails in the second row to one or more negative nodes 560, contacts to a load may be provided at the corresponding nodes. The voltage provided will be four times the voltage of a single cell due to the series connections in each row. Perimeter nodes are also shown with perimeter switches to provide extensive configurability.

In still further embodiments, much larger arrays of cells may be formed with many different configurations possible. Even in a small array of eight cells, one can configure connections such that four pairs of cells are each coupled in series, with the pairs then connected in parallel. This arrangement would provide twice the voltage of a single cell, but much more current. Positive and negative node may be used to connect cells in the array to ensure that each cell is not subjected to too much current.

Figure 6:
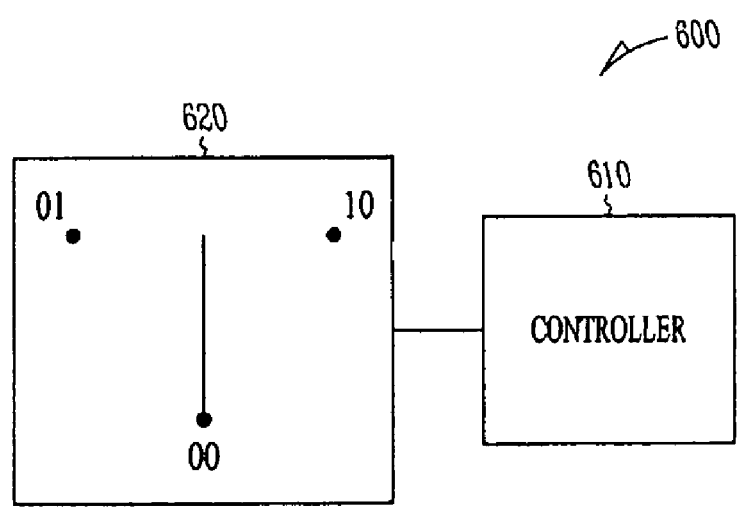
FIG. 6 is a schematic block diagram of a switch control for use with configurable solar cells according to an example embodiment.

FIG. 6 is a schematic block diagram of a switch control 600 for use with configurable solar cells according to an example embodiment. Switch control 600 includes a controller 610, which may be software controlled or otherwise have input to allow a user to configure an array as desired. In one embodiment, several predetermined switch configurations may be preprogrammed into the controller 610 and selected by a user. In further embodiments, a user may be provided a schematic of an array, and may configure switches individually as desired.

One switch is illustrated at 620. It is meant to represent multiple switches, and shown as a single switch for simplicity. In one embodiment, low power MOSFET switches that may be controlled via digital signal may be used. They provide a low power suitable for use with solar cell arrays. In further embodiments, other types of switches, such as mechanical switches including cylindrical moving switches may be used, but may also consume more power. The switches may be integrated with the rails or nodes or both, or may be separate elements.

In one embodiment, the controller 610 provides electrical signals, such as two digit commands to set the switch in a desired position. A '01' may refer to a first position, '10' to a second position, and '00' corresponds to an open position in one embodiment. In further embodiments, longer commands may be used. The switches may be hardwired directly to the controller and addressed, such as by an addressing scheme used in memory circuits to program the switches. In further embodiments, the switches may be networked via wired or wireless methods and provided with an address. The switches may then respond to commands in accordance with a desired protocol. In various embodiments, the switches may be selected such that the can handle the maximum possible system current. In further embodiments, design limits may be placed on the switch settings.

Figure 7:
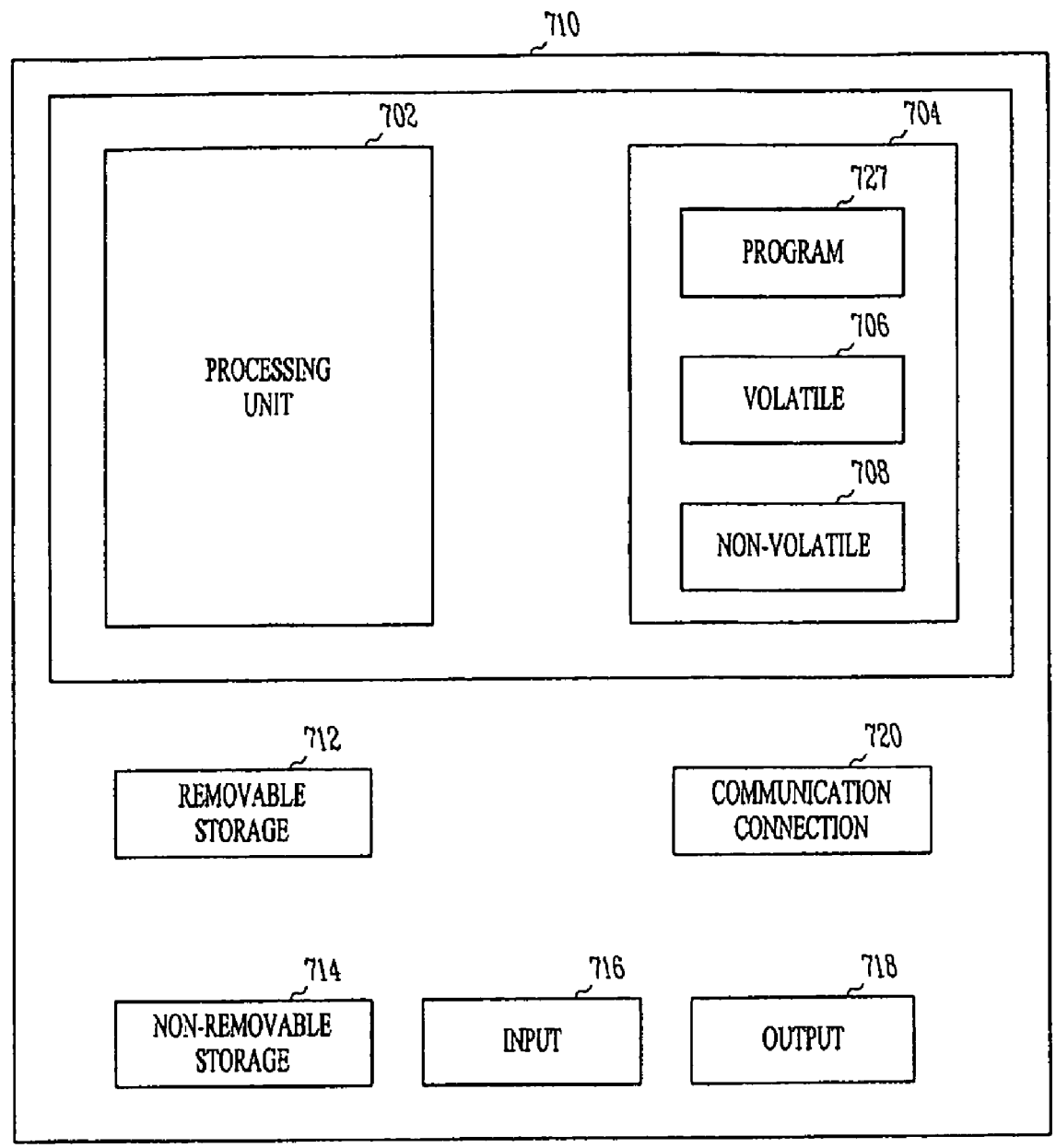
FIG. 7 is a block diagram of a computer system that executes programming for controlling switches to create desired solar cell electrical configurations according to an example embodiment.

A block diagram of a computer system that executes programming for controlling switches to create desired solar cell electrical configurations is shown in FIG. 7. A general computing device in the form of a computer 710, may include a processing unit 702, memory 704, removable storage 712, and non-removable storage 714. Memory 704 may include volatile memory 706 and non-volatile memory 708. Computer 710 may include—or have access to a computing environment that includes—a variety of computer-readable media, such as volatile memory 706 and non-volatile memory 708, removable storage 712 and non-removable storage 714. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 710 may include or have access to a computing environment that includes input 716, output 718, and a communication connection 720. The computer may operate in a networked environment using a communication connection to connect to one or more remote computers. The remote computer may include a personal computer (PC), server, router, network PC, a peer device or other common network node, or the like. The communication connection may include a Local Area Network (LAN), a Wide Area Network (WAN) or other networks.

Computer-readable instructions stored on a computer-readable medium are executable by the processing unit 702 of the computer 710. A hard drive, CD-ROM, and RAM are some examples of articles including a computer-readable medium.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. An array comprising:
   an array of solar cells having positive and negative rails;
   a plurality of positive nodes positioned proximate positive rails of a row of solar cells in the array of solar cells;
   a plurality of negative nodes positioned proximate negative rails of a row of solar cells in the array of solar cells;
   a plurality of intermediate nodes positioned adjacent positive and negative rails of solar cells in the array of solar cells; and
   a plurality of switches positioned to couple positive nodes to positive rails, couple negative nodes to negative rails and couple positive and negative rails to intermediate nodes, wherein all the cells in the array have positive and negative rails oriented in the same directions, and wherein at least three positive nodes are connectable to each positive rail positioned on a top edge of the array, and at least three negative nodes are connectable to each negative rail on a bottom edge of the array.

2. The array of claim 1 wherein positive and negative rails each have four switches associated with them.

3. The array of claim 2 wherein the associated switches are integrated with the solar cells.

4. The array of claim 1 wherein the switches are MOSFET switches.

5. The array of claim 4 wherein the switches are operable to switch between two connected positions and an open position.

6. The array of claim 1 wherein at least one switch is operable to connect two intermediate nodes to each other.

7. The array of claim 1 wherein the intermediate nodes are arranged such that there is an intermediate node between each adjacent solar cell, and at least two intermediate nodes connectable to a solar cell on an outside perimeter of the array.

8. The array of claim 1 wherein the array is configurable in any combination of parallel and series electrical connections.

9. A system comprising:
   an array of solar cells having positive and negative rails;
   a plurality of positive nodes;
   a plurality of negative nodes;
   a plurality of intermediate nodes positioned adjacent positive and negative rails of solar cells in the array of solar cells; and
   a plurality of switches positioned to couple positive nodes to positive rails, couple negative nodes to negative rails and couple positive and negative rails to intermediate nodes, wherein all the cells in the array have positive and negative rails oriented in the same directions, and wherein at least three positive nodes are connectable to each positive rail positioned on a top edge of the array, and at least three negative nodes are connectable to each negative rail on a bottom edge of the array.

10. The system of claim 9 and further comprising a controller coupled to the switches to configure the switches to provide electrical connections between the solar cells in different combinations of series and parallel configurations.

11. The system of claim 10 wherein positive and negative rails each have four switches associated with them.

12. The system of claim 11 wherein the associated switches are integrated with the solar cells.

13. The system of claim 10 wherein the switches are MOSFET switches.

14. The system of claim 13 wherein the switches are controlled by the controller to switch between two connected positions and a disconnected position.

15. The system of claim 14 wherein the controller controls the switch by use of a digital signal comprising 2 bits.

16. The system of claim 10 wherein at least one switch is operable to connect two intermediate nodes to each other.

17. A method of configuring an array of solar cells, the method comprising:
   connecting positive and negative rails of adjacent solar cells in the array of solar cells to a plurality of intermediate nodes positioned adjacent the positive and negative rails of solar cells in the array of solar cells;
   connecting at least one positive rail of a solar cell in the array of solar cells to a positive node; and
   connecting at least one negative rail of a solar cell in the array of solar cells to a negative node, wherein all the cells in the array have positive and negative rails oriented in the same directions, and wherein at least three positive nodes are connectable to each positive rail positioned on a top edge of the array, and at least three negative nodes are connectable to each negative rail on a bottom edge of the array.

18. The method of claim 17 wherein the positive and negative rails are connected by switches to selected nodes to provide electrical connections between the solar cells in different combinations of series and parallel configurations.

19. The method of claim 18 wherein positive and negative rails each have four switches associated with them.

* * * * *